United States Patent
Kishiro et al.

(10) Patent No.: US 8,222,703 B2
(45) Date of Patent: Jul. 17, 2012

(54) SEMICONDUCTOR DEVICE WITH BIPOLAR TRANSISTOR

(75) Inventors: Koichi Kishiro, Tokyo (JP); Koji Yuki, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 665 days.

(21) Appl. No.: 12/076,136

(22) Filed: Mar. 14, 2008

(65) Prior Publication Data
US 2008/0237731 A1    Oct. 2, 2008

(30) Foreign Application Priority Data

Mar. 28, 2007  (JP) ................................ 2007-085459

(51) Int. Cl.
*H01L 27/06*    (2006.01)
(52) U.S. Cl. ............... 257/370; 438/202; 257/E29.255; 257/E21.421
(58) Field of Classification Search .......... 257/37, 257/370, E29.255, E21.421; 438/202–208, 438/234–239
See application file for complete search history.

(56) References Cited

U.S. PATENT DOCUMENTS

| | | | |
|---|---|---|---|
| 5,420,457 A | 5/1995 | Shibib | |
| 6,281,530 B1 | 8/2001 | Johnson | |
| 2003/0155600 A1* | 8/2003 | Shiau et al. | 257/297 |
| 2006/0176628 A1* | 8/2006 | Hasegawa et al. | 361/56 |
| 2007/0194380 A1* | 8/2007 | Okushima | 257/355 |
| 2011/0169993 A1* | 7/2011 | Rhodes | 348/311 |

FOREIGN PATENT DOCUMENTS

| | | |
|---|---|---|
| JP | 03-239336 | 10/1991 |
| JP | 05-021446 | 1/1993 |
| JP | 06-151859 | 5/1994 |
| JP | 06-163832 | 6/1994 |
| JP | 06-244365 | 9/1994 |
| JP | 2002-026029 | 1/2002 |
| JP | 2002-184881 | 6/2002 |

OTHER PUBLICATIONS

Japanese Patent [2002-184881] [certified English's translation].*
Japanese Patent [06244365] [certified English's translation].*
Office Action from Japan Patent Office, drafted May 25, 2010.

* cited by examiner

*Primary Examiner* — Tony Tran
(74) *Attorney, Agent, or Firm* — Kubotera & Associates, LLC

(57) ABSTRACT

A semiconductor device includes a semiconductor layer formed on an insulation layer and having an MOS (Metal Oxide Semiconductor) transistor area and a bi-polar transistor area; an MOS transistor formed in the MOS transistor area; and a bi-polar transistor formed in the bi-polar transistor area. The MOS transistor includes a source area of a second conductive type; a drain area of the second conductive type; and a channel area of a first conductive type. The MOS transistor further includes a gate electrode formed on the channel area with a first oxide layer inbetween. The bi-polar transistor includes a collector area of the second conductive type; an emitter area of the second conductive type; and a base area of the first conductive type. The bi-polar transistor further includes a dummy pattern formed on the base area with a second oxide layer inbetween.

4 Claims, 15 Drawing Sheets

SEMICONDUCTOR DEVICE WITH BIPOLAR TRANSISTOR

BACKGROUND OF THE INVENTION AND RELATED ART STATEMENT

The present invention relates to a semiconductor device and a method of producing the semiconductor device. In particular, the present invention relates to a semiconductor device, in which an MOS (Metal Oxide Semiconductor) transistor and a lateral bi-polar transistor are formed on a same SOI (Silicon On Insulator) substrate.

Conventionally, various types of lateral bi-polar transistors have been formed on SOI substrates (refer to Patent References 1 to 3).

Patent Reference 1: Japanese Patent Publication No. 05-21446

Patent Reference 2: Japanese Patent Publication No. 2002-26029

Patent Reference 3: Japanese Patent Publication No. 06-244365

For example, in Patent Reference 1, a base electrode formed of a doped poly-silicon is formed on a base area. Further, another base area is divided with a sidewall insulation layer.

In Patent Reference 2, electrodes formed of doped poly-silicon layers are formed on an emitter area, a base area, and a collector area, respectively.

Patent Reference 3 has disclosed a conventional semiconductor device and a conventional method of producing the conventional semiconductor device. In the conventional semiconductor device, an MOS (Metal Oxide Semiconductor) transistor and a lateral bi-polar transistor are formed on an SOI (Silicon On Insulator) substrate, thereby obtaining a so-called BiCMOS structure.

In the conventional semiconductor device disclosed in Patent Reference 3, a base area of the bi-polar transistor is divided with a sidewall formed of a silicon oxide layer. Further, according to the conventional method disclosed in Patent Reference 3, an impurity is diffused from a doped poly-silicon layer formed on an SOI layer, thereby forming a source/drain area of the MOS transistor.

In the conventional semiconductor devices disclosed in Patent References 1 and 2, the electrode formed of a doped poly-silicon is formed directly on the base area and the likes of the bi-polar transistor. Accordingly, an impurity may be diffused into the base area and the likes. As a result, an adverse effect may occur during an operation of the bi-polar transistor (bi-polar action).

Further, in the semiconductor devices disclosed in Patent References 1 and 3, the base area is divided with the sidewall. In general, the sidewall has a narrow width of about 0.1 to 0.15 μm. Accordingly, the base area tends to have a small (narrow) width (length), thereby lowering voltage resistance. When the width of the sidewall needs to change, it is necessary to indirectly adjust an etching condition in forming the sidewall, a material of the sidewall, a height of the gate electrode, and the likes. Accordingly, it is difficult to control and change the width of the sidewall significantly.

Further, when the width of the sidewall is changed at one portion, it is necessary to change the width of the sidewalls at all of portions on the SOI substrate. Accordingly, when the width of the sidewall of the bi-polar transistor with the BiCMOS structure is enlarged, the width of the sidewall of the MOS transistor is enlarged as well, thereby affecting an operation of the MOS transistor.

In the conventional method of producing the BiCMOS structure disclosed in Patent Reference 3, the MOS transistor is formed with a process different from that of producing an ordinary MOS transistor. Accordingly, when the method is applied to a mass production line, it is necessary to greatly tune the process of forming the ordinary MOS transistor. Especially, it is difficult to control the impurity to be diffused into the SOI layer through the doped poly-silicon layer. Accordingly, it is difficult to form a desired source/drain area.

In view of the problems described above, an object of the present invention is to provide a semiconductor device, in which it is possible to form an MOS resistor and a bi-polar transistor on a same SOI substrate, thereby obtaining a lateral bi-polar transistor with high voltage resistance.

Further, an object of the present invention is to provide a method of producing the semiconductor device, in which the MOS transistor and the bi-polar transistor are formed on the same SOI substrate, without significantly changing a method of producing an ordinary MOS transistor.

Further objects and advantages of the invention will be apparent from the following description of the invention.

SUMMARY OF THE INVENTION

In order to attain the objects described above, according to a first aspect of to the present invention, a semiconductor device includes a semiconductor layer formed on an insulation layer and having an MOS (Metal Oxide Semiconductor) transistor area or an MOS (Metal Oxide Semiconductor) transistor portion and a bi-polar transistor area or a bi-polar transistor portion; an MOS (Metal Oxide Semiconductor) transistor formed in the semiconductor layer in the MOS transistor area; and a bi-polar transistor formed in the semiconductor layer in the bi-polar transistor area.

The MOS transistor includes a source area or a source portion of a second conductive type; a drain area or a drain portion of the second conductive type; and a channel area or a channel portion of a first conductive type formed between the source area and the drain area. The MOS transistor further includes a gate electrode formed on the channel area with a first oxide layer inbetween. The bi-polar transistor includes a collector area or a collector portion of the second conductive type; an emitter area or an emitter portion of the second conductive type; and a base area or a base portion of the first conductive type formed between the collector area and the emitter area. The bi-polar transistor further includes a base contact area or a base contact portion of the first conductive type adjacent to the base area of the first conductive type in a channel width direction; and a dummy pattern formed on the base area with a second oxide layer inbetween.

According to a second aspect of to the present invention, a method of producing a semiconductor device includes the steps of:

preparing a semiconductor layer having an MOS (Metal Oxide Semiconductor) transistor area or an MOS transistor portion with a first MOS transistor area or a first MOS transistor portion of a first conductive type and a second MOS transistor area or a second MOS transistor portion of a second conductive type, and a bi-polar transistor area or a bi-polar transistor portion on an insulation layer;

forming an element area or an element portion and an element separation area or an element separation portion in the semiconductor layer in each of the MOS transistor area and the bi-polar transistor area;

forming a gate electrode on the semiconductor layer in the element area in the MOS transistor area, and forming a dummy pattern on the semiconductor layer in the element area in the bi-polar transistor area;

introducing an impurity of the first conductive type into the semiconductor layer in the first MOS transistor area and the bi-polar transistor area to form a source area or a source portion of the first conductive type and a drain area or a drain portion of the first conductive type both sandwiching a channel area or a channel portion formed below the gate electrode in the first MOS transistor area of the first conductive type, and to form a base contact area or a base contact portion of the first conductive type adjacent to a base area below the dummy pattern in a channel width direction; and introducing an impurity of the second conductive type into the semiconductor layer in the second MOS transistor area of the second conductive type and the bi-polar transistor area to form a source area or a source portion of the second conductive type and a drain area or a drain portion of the second conductive type both sandwiching a channel area or a channel portion formed below the gate electrode in the second MOS transistor area of the second conductive type, and to form a collector area or collector portion of the second conductive type and an emitter area or an emitter portion of the second conductive type both sandwiching the base area below the dummy pattern.

In the first aspect of to the present invention, the semiconductor device includes the MOS transistor and the bi-polar transistor area on an SOI (Silicon On Insulator) substrate. Accordingly, it is possible to securely perform a bi-polar action and obtain a sufficient resistance voltage of the bi-polar transistor.

In the second aspect of to the present invention, it is possible to form the MOS transistor and the bi-polar transistor area on a same SOI (Silicon On Insulator) substrate without drastically changing an ordinary method of forming an MOS transistor on an SOI (Silicon On Insulator) substrate.

BRIEF DESCRIPTION OF THE DRAWINGS

FIGS. 1(A) and 1(B) are schematic views showing a semiconductor device according to a first embodiment of the present invention, wherein FIG. 1(A) is a sectional view thereof taken along a line 1(A)-1(A) in FIG. 1(B), and FIG. 1(B) is a plan view of the semiconductor device;

FIGS. 3(A) and 3(B) are schematic sectional views showing the semiconductor device according to the first embodiment of the present invention, wherein FIG. 3(A) is a sectional view corresponding to the sectional view taken along the line 1(A)-1(A) in FIG. 1(B), and FIG. 3(B) is a sectional view thereof with a wiring layer formed thereon;

FIGS. 15(A) and 15(B) are schematic sectional views showing the semiconductor device according to the first embodiment of the present invention, wherein FIG. 15(A) is a sectional view thereof taken along a line 15(A)-15(A) in FIG. 14, and FIG. 15(B) is a sectional view thereof with a wiring layer formed thereon.

DETAILED DESCRIPTION OF PREFERRED EMBODIMENTS

Figure 1A:
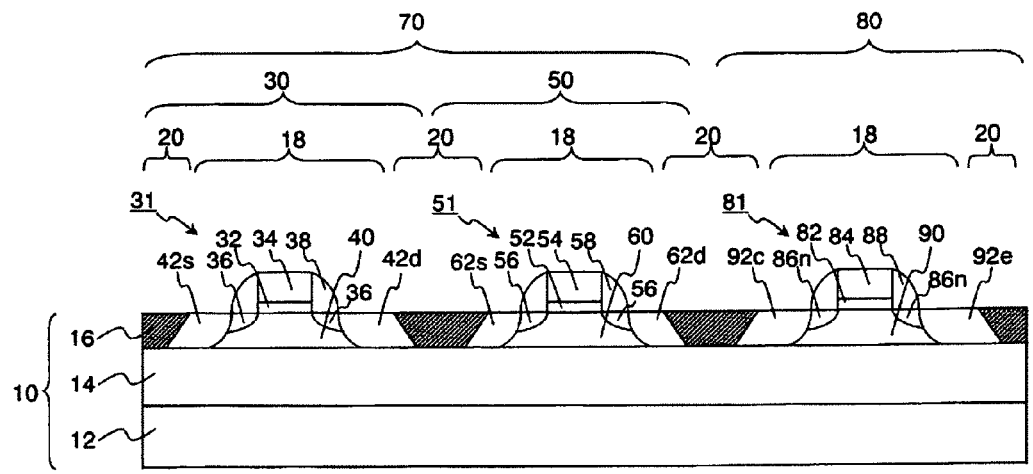

Hereunder, embodiments of the present invention will be explained with reference to the accompanying drawings. In the following description of the present invention, each of the drawings is illustrated schematically in terms of a shape, a size, and a dimensional relationship for explaining the embodiments of the present invention, and the present invention is not limited to the shape, the size, and the dimensional relationship shown in the drawings.

First Embodiment

A first embodiment of the present invention will be explained with reference to FIGS. 1(A) and 1(B) to 8.

FIGS. 1(A) and 1(B) to 3(A) and 3(B) are schematic sectional views and plan views showing a semiconductor device according to the first embodiment of the present invention. FIGS. 4(A) to 4(D) to 7(A) and 7(B) are schematic sectional views showing a method of producing the semiconductor device according to the first embodiment of the present invention. FIG. 8 is a graph showing an experimental result of an operational characteristic of a bi-polar transistor of the semiconductor device according to the first embodiment of the present invention.

Figure 1B:
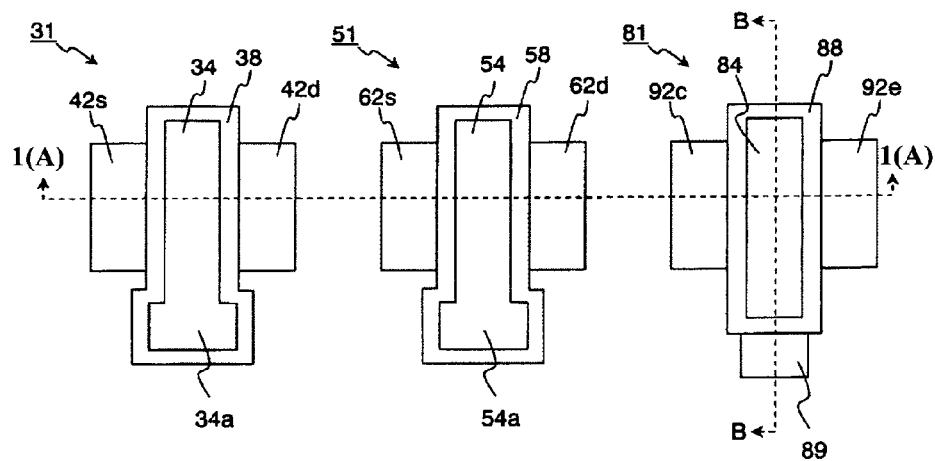
Figure 2:
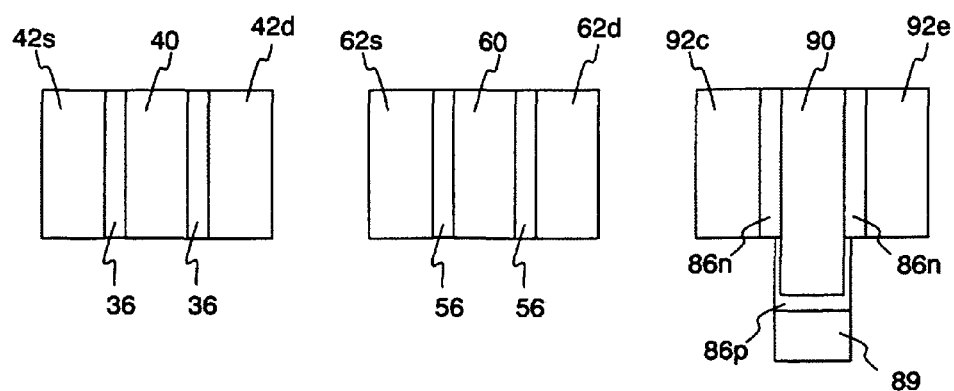
FIG. 2 is a schematic plan view showing the semiconductor device without an upper structure above an SOI (Silicon On Insulator) layer according to the first embodiment of the present invention.
Figure 3A:
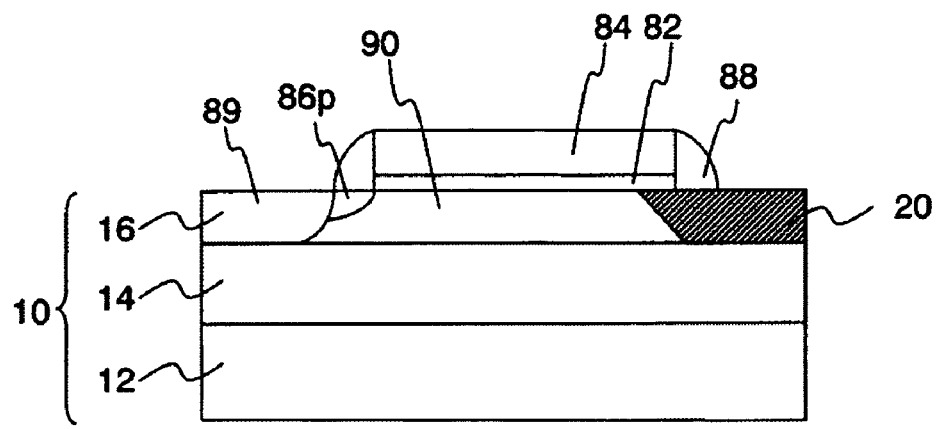
Figure 3B:
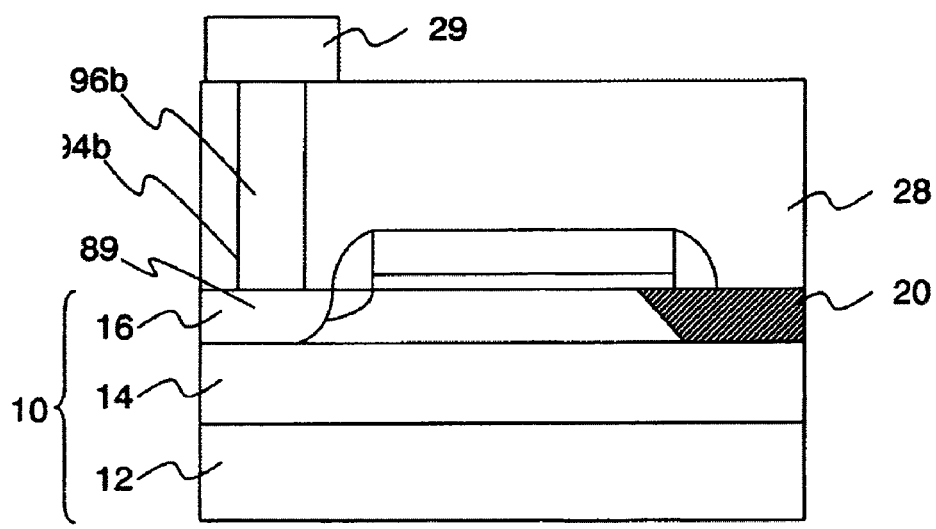

A configuration of the semiconductor device will be explained first with reference to FIGS. 1(A) and 1(B) to 3(A) and 3(B). FIG. 1(A) is a sectional view of the semiconductor device taken along a line 1(A)-1(A) in FIG. 1(B) according to the first embodiment of the present invention, and FIG. 1(B) is a plan view of the semiconductor device according to the first embodiment of the present invention. FIG. 2 is a schematic plan view showing the semiconductor device without an upper structure above an SOI (Silicon On Insulator) layer 16 according to the first embodiment of the present invention. FIG. 3(A) is a sectional view of the semiconductor device corresponding to the sectional view taken along the line 1(A)-1(A) in FIG. 1(B), and FIG. 3(B) is a sectional view thereof with a wiring layer formed thereon.

As shown in FIG. 1(A), an embedded oxide film 14 as an insulation layer is formed on a support substrate 12. An SOI (Silicon On Insulator) layer 16 as a semiconductor layer is formed on the embedded oxide film 14. Accordingly, an SOI (Silicon On Insulator) substrate 10 is formed of the support substrate 12, the embedded oxide film 14, and the SOI layer 16.

In the embodiment, the support substrate 12 is formed of single-crystal silicon. Further, the embedded oxide film 14 is formed of silicon dioxide, and the SOI layer 16 is formed of single-crystal silicon. The support substrate 12 has a thickness of about 300 μm, the embedded oxide film 14 has a thickness of about 150 nm, and the SOI layer 16 has a thickness of about 50 nm.

In the embodiment, the SOI structure is adopted, and the present invention is applicable to an SOS (Silicon on Sapphire) substrate using sapphire as an insulation layer or an SOQ (Silicon on Quartz) substrate using quartz as an insulation layer.

In the embodiment, the SOI layer 16 includes a p-type MOS (Metal Oxide Semiconductor) transistor area or a p-type MOS (Metal Oxide Semiconductor) transistor portion 30 where a p-type MOS transistor 31 is formed as an MOS transistor of a first conductive type; an n-type MOS (Metal Oxide Semiconductor) transistor area or an n-type MOS (Metal Oxide Semiconductor) transistor portion 50 where an n-type MOS transistor 51 is formed as an MOS transistor of a second conductive type; and a bi-polar transistor area or a bi-polar transistor portion 80 where a bi-polar transistor 81 is formed. A plurality of element areas or element portions 18 is formed in the p-type MOS transistor area 30, the n-type MOS transistor area 50, and the bi-polar transistor area 80. Element separation areas or element separation portions 20 formed of silicone dioxide and the likes divide the element areas 18.

In the embodiment, the p-type MOS transistor 31, the n-type MOS transistor 51, and the bi-polar transistor 81 are formed in the element areas 18, respectively. In the following description, the p-type MOS transistor area 30 and the n-type MOS transistor area 50 are collectively referred to as an MOS transistor area 70.

In the embodiment, a plurality of p-type MOS transistors may be formed in the p-type MOS transistor areas 30. In FIG. 1(A), one p-type MOS transistor 31 is shown, and the p-type MOS transistor 31 has a well-known structure. That is, a channel area or a channel portion 40 is formed in the SOI layer 16. The channel area 40 has the second conductive type, i.e., the n-type.

In the embodiment, the channel area 40 contains an n-type dopant at a low concentration (n⁻) of $1\times10^{17}$ cm$^{-3}$ to $1\times10^{18}$ cm$^{-3}$. A source area or a sour portion 42s and a drain area or a drain portion 42d are disposed with the channel area 40 inbetween. The source area 42s and the drain area 42d have the first conductive type, i.e., the p-type. The source area 42s and the drain area 42d contain a p-type dopant at a high concentration (p⁺) of about $1\times10^{20}$ cm$^{-3}$.

In the embodiment, in the channel area 40, LDD (Lightly Doped Drain) areas or LDD portions 36 are formed in a front layer area of the SOI layer 16 near a boundary between the channel area 40 and the source area 42s, and a boundary between the channel area 40 and the drain area 42d. The LDD areas 36 have the first conductive type, i.e., the p-type. Further, the LDD areas 36 contain an n-type dopant at a low concentration (n⁻) of about $1\times10^{19}$ cm$^{-3}$, lower than that of the n-type dopant of the source area 42s and the drain area 42d.

In the embodiment, a gate oxide film 32 formed of silicon dioxide is disposed on the channel area 40. A gate electrode 34 formed of poly-silicon (poly-crystal silicon) is disposed on the gate oxide film 32. More specifically, the gate electrode 34 has an impurity concentration (concentration of the p-type impurity or boron) of about $1\times10^{20}$ cm$^{-3}$, and is formed of so-called doped poly-silicon. Further, the gate electrode 34 has a film thickness of, for example, 200 nm, and a length of, for example, 200 nm in a gate length direction.

In the embodiment, a sidewall 38 formed of silicon dioxide is disposed on side surfaces of the gate electrode 34 and the gate oxide film 32. As shown in FIGS. 1(B) and 2, the channel area 40, the source area 42s, the drain area 42d, the LDD areas 36, the gate electrode 34, and the sidewall 38 have rectangular shapes.

As shown in FIG. 1(B), the gate electrode 34 extends in a channel width direction (vertical direction in FIG. 1(B)), and includes a gate contact area 34a with a wide width at a portion other than above the channel area 40. A contact plug is formed on the gate contact area 34a using tungsten and the likes, so that a gate voltage is applied to the gate electrode 34. It is preferred that the gate contact area 34a has a wide width as shown in FIG. 1(B) considering a dimensional error of a contact hole. The gate contact area 34a does not necessarily have a wide width when it is possible to produce accurately. Note that the gate contact area 34a forms a part of the gate electrode 34.

In the embodiment, a plurality of n-type MOS transistors may be formed in the n-type MOS transistor areas 50. In FIG. 1(A), one n-type MOS transistor 51 is shown, and the n-type MOS transistor 51 has a well-known structure. That is, a channel area or a channel portion 60 is formed in the SOI layer 16. The channel area 60 has the first conductive type, i.e., the p-type.

In the embodiment, the channel area 60 contains a p-type dopant at a low concentration (p⁻) of $1\times10^{17}$ cm$^{-3}$ to $1\times10^{18}$ cm$^{-3}$. A source area or a source portion 62s and a drain area a drain portion 62d are disposed with the channel area 60 inbetween. The source area 62s and the drain area 62d have the second conductive type, i.e., the n-type. The source area 62s and the drain area 62d contain an n-type dopant at a high concentration (n⁺) of about $1\times10^{20}$ cm$^{-3}$.

In the embodiment, in the channel area 60, LDD areas or LDD portions 56 are formed in a front layer area of the SOI layer 16 near a boundary between the channel area 60 and the source area 62s, and a boundary between the channel area 60 and the drain area 62d. The LDD areas 56 have the second conductive type, i.e., the n-type. Further, the LDD areas 56 contain an n-type dopant at a low concentration (n⁻) of about $1\times10^{19}$ cm$^{-3}$, lower than that of the n-type dopant of the source area 62s and the drain area 62d.

In the embodiment, a gate oxide film 52 formed of silicon dioxide as a first oxide film is disposed on the channel area 60. A gate electrode 54 formed of poly-silicon (poly-crystal silicon) is disposed on the gate oxide film 52. More specifically, the gate electrode 54 has an impurity concentration (concentration of the n-type impurity or phosphorous) of about $1\times10^{20}$ cm$^3$, and is formed of so-called doped poly-silicon.

In the embodiment, a sidewall 58 formed of silicon dioxide is disposed on side surfaces of the gate electrode 54 and the gate oxide film 52. As shown in FIGS. 1(B) and 2, the channel area 60, the source area 62s, the drain area 62d, the LDD areas 56, the gate electrode 54, and the sidewall 58 have rectangular shapes.

As shown in FIG. 1(B), the gate electrode 54 extends in the channel width direction (vertical direction in FIG. 1(B)), and includes a gate contact area 54a with a wide width at a portion other than above the channel area 60. A contact plug is formed on the gate contact area 54a using tungsten and the likes, so that a gate voltage is applied to the gate electrode 54. It is preferred that the gate contact area 54a has a wide width as shown in FIG. 1(B) considering a dimensional error of a contact hole. The gate contact area 54a does not necessarily have a wide width when it is possible to produce accurately. Note that the gate contact area 54a forms a part of the gate electrode 54.

In the embodiment, the gate electrode 34 of the p-type MOS transistor 31 in the p-type MOS transistor area 30 has a length in a channel length direction (direction along the line 1(A)-1(A) in FIG. 1(B)) substantially same as that of the gate electrode 54 of the n-type MOS transistor 51 in the n-type MOS transistor area 50 in the channel length direction. The lengths of the channel area 40 and the channel area 60 in the channel length direction are defined with the gate electrode 34, the gate electrode 54, the sidewall 38, and the sidewall 58, respectively.

Accordingly, the channel area 40 of the p-type MOS transistor 31 in the p-type MOS transistor area 30 has a length in the channel length direction (including the LDD areas 36 in the front layer area) substantially same as that of the channel area 60 of the n-type MOS transistor 51 in the n-type MOS transistor area 50 in the channel length direction. Similarly, the source area 42s and the drain area 42d of the p-type MOS transistor 31 in the p-type MOS transistor area 30 have a length in the channel length direction substantially same as that of the source area 62s and the drain area 62d of the n-type MOS transistor 51 in the n-type MOS transistor area 50 in the channel length direction.

In the embodiment, a plurality of bi-polar transistors may be formed in the bi-polar transistor areas 80. In FIG. 1(A), one bi-polar transistor 31 is shown. That is, a base area or a base portion 90 is formed in the SOI layer 16. The base area 90 has the first conductive type, i.e., the p-type.

In the embodiment, the base area 90 contains a p-type dopant at a low concentration (p$^-$) of $1\times10^{17}$ cm$^{-3}$ to $1\times10^{18}$ cm$^{-3}$. A collector area or a collector portion 92c and an emitter area or an emitter portion 92e are disposed with the base area 90 inbetween. The collector area 92c and the emitter area 92e have the second conductive type, i.e., the n-type. The collector area 92c and the emitter area 92e contain an n-type dopant at a high concentration (n$^+$) of about $1\times10^{20}$ cm$^{-3}$.

As shown in FIGS. 2 and 3(A), a base contact area or a base contact portion 89 is formed in the SOI layer 16 in an area adjacent to the base area 90 in a channel width direction (direction along the line 1(A)-1(A) in FIG. 1(B)). The base contact area 89 has the first conductive type, i.e., the p-type, and contains a p-type dopant at a high concentration (p$^+$). As shown in FIG. 3(B), a base contact plug 96b is formed on the base contact area 89, so that the base contact area 89 functions as an electrode of the base area 90 and receives a base voltage.

In the embodiment, a second oxide film 82 formed of silicon dioxide is disposed on the base area 90. A dummy pattern 84 formed of poly-silicon (poly-crystal silicon) is disposed on the second oxide film 82. More specifically, the dummy pattern 84 has an impurity concentration (concentration of the n-type impurity or phosphorous) of about $1\times10^{20}$ cm$^{-3}$, and is formed of so-called doped poly-silicon. That is, the dummy pattern 84 is formed of a material same as that of the gate electrode 34 and the gate electrode 54. Further, a sidewall 88 formed of silicon dioxide is disposed on side surfaces of the dummy pattern 84 and the second oxide film 82.

In the embodiment, the dummy pattern 84 looks as if a gate electrode of an MOS transistor. However, the dummy pattern 84 does not function as an electrode of a base, a collector, or an emitter. Accordingly, the dummy pattern 84 is referred to as a dummy pattern, and is not electrically connected to any of wiring portions, so that the dummy pattern 84 has a potential in a floating state. In a process of producing the semiconductor device (described later), the dummy pattern 84 is used merely as a mask together with the sidewall 88 for defining the collector area 92c, the emitter area 92e, the base contact area 89, and the base area 90.

As shown in FIGS. 1(B) and 2, the base area 90, the collector area 92c, the emitter area 92e, the base contact area 89, the LDD areas 86n and 86p, the dummy pattern 84, and the sidewall 88 have rectangular shapes. As shown in FIG. 1(B), different from the gate electrode 34 and the gate electrode 54, the dummy pattern 84 does not have a contact area with a wide width for forming a contact plug. That is because the dummy pattern 84 does not function as an electrode of a base, a collector, or an emitter.

As shown in FIG. 2, the base area 90 is defined with the dummy pattern 84. More specifically, the base area 90 is formed in the SOI layer 16 below areas where the dummy pattern 84 and the sidewall 88 are formed in the element area 18. Similarly, LDD areas 86n and an LDD area 86p are formed in the SOI layer 16 below an area where the sidewall 88 is formed in the element area 18.

In the embodiment, the sidewall 88 is not necessarily provided in the bi-polar transistor 81 in the bi-polar transistor area 80. In this case, the base area 90 is defined only with the dummy pattern 84. More specifically, the base area 90 is formed in the SOI layer 16 below a portion where the dummy pattern 84 is formed. Note that, in this case, the LDD areas 86n and the LDD area 86p are not formed.

In the configuration describe above, the dummy pattern 84 in the bi-polar transistor area 80 has a length in the channel length direction substantially same as that of the gate electrode 34 or the gate electrode 54 of the p-type MOS transistor 31 or the n-type MOS transistor 51 in the p-type MOS transistor area 30 or the n-type MOS transistor area 50 in the channel length direction.

Alternatively, the length the dummy pattern 84 in the bi-polar transistor area 80 in the channel length direction may be adjusted according to a desired bi-polar transistor characteristic. In other words, the dummy pattern 84 in the bi-polar transistor area 80 does not necessarily have a length in the channel length direction substantially same as that of the gate electrode 34 or the gate electrode 54 of the p-type MOS transistor 31 or the n-type MOS transistor 51 in the p-type MOS transistor area 30 or the n-type MOS transistor area 50 in the channel length direction.

As described above, in the embodiment, the second oxide film 82 is disposed between the base area 90 and the dummy pattern 84. Accordingly, the impurity in the dummy pattern 84 does not likely leak into the base area 90. As a result, it is possible to reduce an adverse effect on an operation of the bi-polar transistor (bi-polar action) due to the impurity in the dummy pattern 84 leaking into the base area 90. Note that the base contact area 89 adjacent to the base area 90 in the channel width direction functions as the electrode. Accordingly, it is not necessary to provide an electrode on the base area 90, thereby making it possible to dispose the second oxide film 82 between the base area 90 and the dummy pattern 84.

Further, in the embodiment, the base area 90 of the bi-polar transistor 81 in the bi-polar transistor area 80 is defined with the dummy pattern 84. It is possible to form the dummy pattern 84 in an arbitrary shape using a resist pattern. Accordingly, it is possible to freely adjust a width of the base area 90. As a result, it is possible to obtain a sufficient length of the base area 90 in the channel length direction, and to increase a resistance voltage of the bi-polar transistor 81.

A method of producing the semiconductor device according to the first embodiment of the present invention will be explained next with reference to FIGS. 4(A) to 4(D) to 7(A) and 7(B). FIGS. 4(A) to 4(D) to 7(A) and 7(B) are schematic sectional views showing the method of producing the semiconductor device corresponding to sectional views taken along the line 1(A)-1(A) in FIG. 1(B).

Figure 4A:
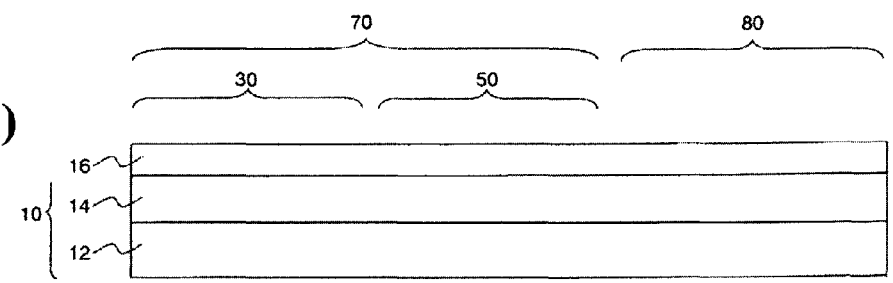
FIGS. 4(A) to 4(D) are schematic sectional views showing a method of producing the semiconductor device corresponding to sectional views taken along the line 1(A)-1(A) in FIG. 1(B) according to the first embodiment of the present invention.

First, as shown in FIG. 4(A), the SOI substrate 10 is prepared through a well-known technology such as a bonding method, an SIMOX method, and the likes. In the SOI substrate 10, the embedded oxide film 14 as an insulation layer is formed on the support substrate 12, and the SOI (Silicon On Insulator) layer 16 as a semiconductor layer is formed on the embedded oxide film 14.

In the embodiment, the support substrate 12 is formed of single-crystal silicon; the embedded oxide film 14 is formed of silicon dioxide; and the SOI layer 16 is formed of single-crystal silicon. Further, the support substrate 12 has a thickness of about 300 μm, the embedded oxide film 14 has a thickness of about 150 nm, and the SOI layer 16 has a thickness of about 50 nm.

In the embodiment, the SOI structure using the embedded oxide film 14 as the insulation layer is adopted, and the present invention is applicable to an SOS (Silicon on Sapphire) substrate using sapphire as an insulation layer or an SOQ (Silicon on Quartz) substrate using quartz as an insulation layer.

In the embodiment, the SOI layer 16 includes the p-type MOS transistor area 30 where the p-type MOS transistor 31 is formed as the MOS transistor of the first conductive type; the n-type MOS transistor area 50 where the n-type MOS transistor 51 is formed as the MOS transistor of the second conductive type; and the bi-polar transistor area 80 where the bi-polar transistor 81 is formed. Note that the p-type MOS transistor area 30 and the n-type MOS transistor area 50 are collectively referred to as the MOS transistor area 70.

Figure 4B:
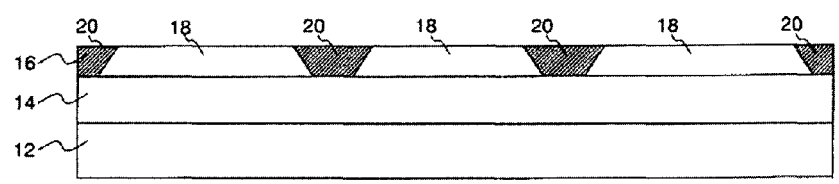

In the next step, as shown in FIG. 4(B), the element separation areas 20 are formed for electrically separating each transistor element. The element separation areas 20 are formed of silicone dioxide and the likes through a well-known method such as an STI method. At the same time, the element areas 18 surrounded with the element separation areas 20 are defined, and the transistor elements are formed in the element areas 18 in the following steps. Further, the element separation areas 20 are formed between the p-type MOS transistor area 30 and the n-type MOS transistor area 50, and between the MOS transistor area 70 and the bi-polar transistor area 80.

Figure 4C:
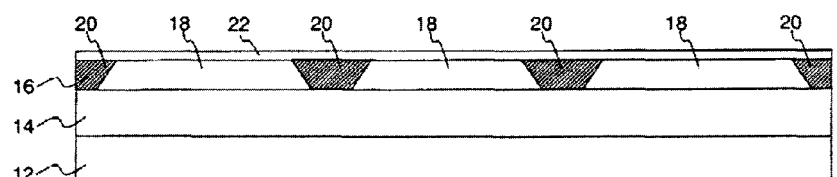

In the next step, as shown in FIG. 4(C), a first oxide film 22 is formed on the SOI layer 16 including the MOS transistor area 70 and the bi-polar transistor area 80 through a thermal oxidation method and the likes. Note that the first oxide film 22 functions as the gate oxide film after patterning. The first oxide film 22 is formed of silicon dioxide, and has a film thickness of about 45 Å.

Figure 4D:
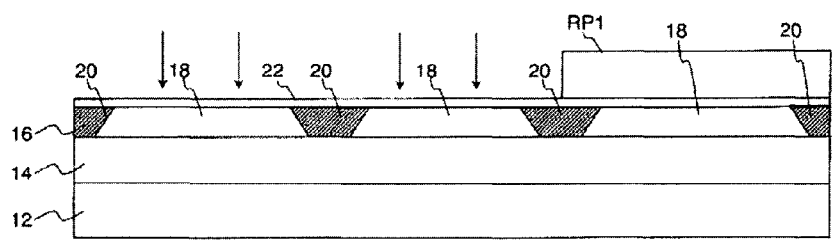

In the next step, as shown in FIG. 4(D), an ion implantation is performed with respect to the element areas 18 in the MOS transistor area 70 for adjusting a threshold value (Vt control ion implantation). More specifically, a resist pattern RP1 is formed on the bi-polar transistor area 80 with a well-known lithography method, and the ion implantation is performed with the resist pattern RP1 as a mask. Accordingly, it is possible to perform the ion implantation with respect to the element areas 18 in the MOS transistor area 70. After the ion implantation is performed, the resist pattern RP1 is removed through ashing.

Figure 5A:
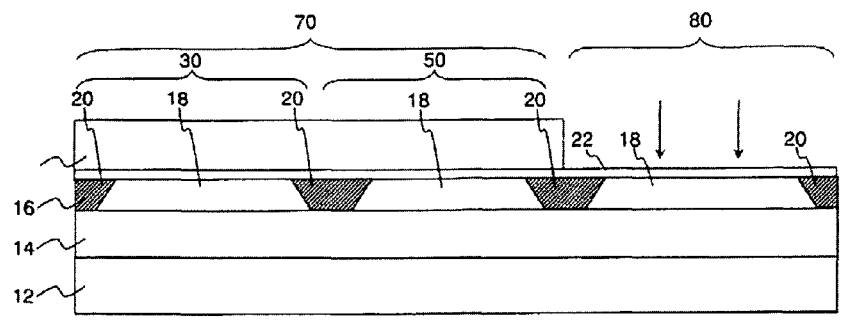
FIGS. 5(A) to 5(D) are schematic sectional views showing the method of producing the semiconductor device corresponding to sectional views taken along the line 1(A)-1(A) in FIG. 1(B) according to the first embodiment of the present invention.

In the next step, as shown in FIG. 5(A), an ion implantation is performed with respect to the element area 18 in the bi-polar transistor area 80 for adjusting the bi-polar transistor characteristic (base-control ion implantation). More specifically, a resist pattern RP3 is formed on the MOS transistor area 70 with a well-known lithography method, and the ion implantation is performed with the resist pattern RP3 as a mask. Accordingly, it is possible to perform the ion implantation with respect to the element area 18 in the bi-polar transistor area 80. After the ion implantation is performed, the resist pattern RP3 is removed through ashing, so that the first oxide film 22 is exposed.

Figure 5B:
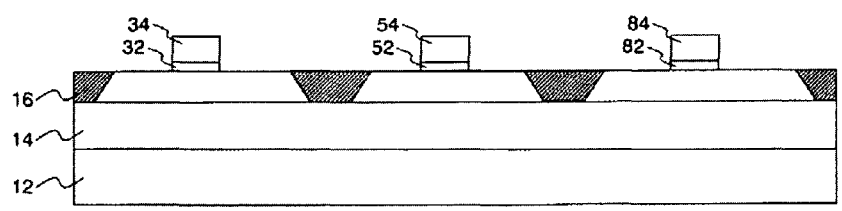

In the next step, as shown in FIG. 5(B) and FIG. 1(B), the gate electrode 34, the gate electrode 54, and the dummy pattern 84 are formed on the SOI layer 16 in the p-type MOS transistor area 30, the n-type MOS transistor area 50, and the bi-polar transistor area 80, respectively. More specifically, a thin film of poly-silicon (not shown) is formed on the first oxide film 22 on the SOI layer 16 in the MOS transistor area 70 and the bi-polar transistor area 80 through a CVD method and the likes. The thin film has a thickness of about 200 nm. The thin film may be formed of tungsten silicide.

Then, the thin film and the first oxide film 22 are patterned with a well-known photolithography and etching. Accordingly, as shown in FIG. 5(B), the gate electrode 34 and the gate electrode 54 are formed on the SOI layer 16 in the element areas 18 of the p-type MOS transistor area 30 and the n-type MOS transistor area 50 through the gate oxide film 32 and the gate oxide film 52, respectively. At the same time, the dummy pattern 84 is formed on the SOI layer 16 in the element area 18 of the bi-polar transistor area 80 through the second oxide film 82.

In the embodiment, the gate electrode 34, the gate electrode 54, and the dummy pattern 84 have shapes in a plan view as shown in FIG. 1(B). Note that the gate electrode 34 and the gate electrode 54 need to contact with upper layers thereof for receiving a gate potential. To this end, the gate electrode 34 and the gate electrode 54 preferably have the gate contact areas 34a and 54a with a wide width. On the other hand, the dummy pattern 84 is not used as an electrode, so that the dummy pattern 84 does not need to have a contact area with a wide width.

Figure 5C:
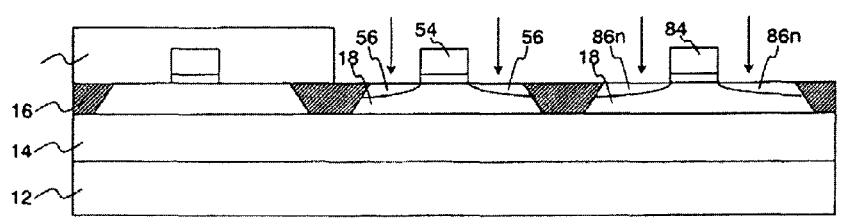

In the next step, as shown in FIG. 5(C), the LDD areas 56 of the n-type (n-type) having a concentration lower than that of the source area 62s and the drain area 62d (described later) are formed in the element area 18 of the n-type MOS transistor area 50. At the same time, the LDD areas 86n of the n-type having a concentration lower than that of the collector area 92c and the emitter area 92e (described later) are formed in the element area 18 of the bi-polar transistor area 80.

More specifically, a resist pattern RP5 is formed on the p-type MOS transistor area 30 and the bi-polar transistor area 80 in an area except areas where the collector area 92c and the gate oxide film 52e are formed and surrounding areas thereof. Then, the n-type impurity such as arsenic (As) is introduced through an ion plantation under conditions at 20 keV and a dose amount of $1\times10^{13}$ cm$^{-2}$ with the resist pattern RP5, the gate electrode 54, and the dummy pattern 84 as masks.

Accordingly, the LDD areas 56 of the n$^-$ type are formed in a front layer area of the SOI layer 16 in the element area 18 of the n-type MOS transistor area 50 in areas not covered with the gate electrode 54. At the same time, the LDD areas 86n of the n$^-$ type are formed in a front layer area of the SOI layer 16 in the element area 18 of the bi-polar transistor area 80 in areas not covered with the resist pattern RP5 and the gate electrode 54. After the ion plantation is performed, the resist pattern RP5 is removed through ashing.

In general, it is not necessary to dispose the LDD areas 86n in the bi-polar transistor area 80. In the embodiment, the LDD areas 86n are formed in the bi-polar transistor area 80, so that a photo-mask for forming the resist pattern RP5 can be used in a step shown in FIG. 6(C).

Figure 5D:
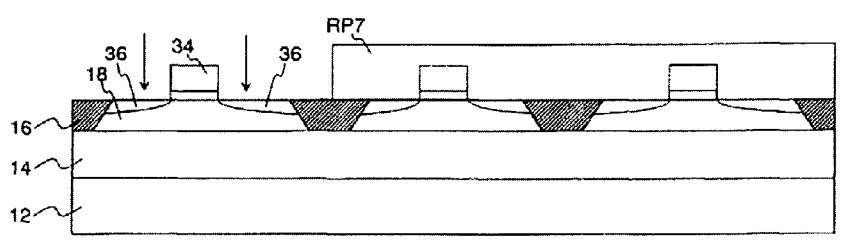

In the next step, as shown in FIG. 5(D), the LDD areas 36 of the p-type (p$^-$ type) having a concentration lower than that of the source area 42s and the drain area 42d are formed in the element area 18 of the p-type MOS transistor area 30. At the same time, the LDD area 86p of the p-type having a concentration lower than that of the base contact area 89 is formed in the element area 18 of the bi-polar transistor area 80.

More specifically, a resist pattern RP7 is formed on the n-type MOS transistor area 50 and the bi-polar transistor area 80 in an area except areas where the collector area 92c and the emitter area 92e are formed and surrounding areas thereof. Then, the p-type impurity such as boron difluoride (BF$_2$) is introduced through an ion plantation under conditions at 15 keV and a dose amount of $1\times10^{13}$ cm$^{-2}$ with the resist pattern RP7 and the gate electrode 34 as masks.

Accordingly, the LDD areas 36 of the p$^-$ type are formed in a front layer area of the SOI layer 16 in the element area 18 of the n-type MOS transistor area 50 in areas not covered with the gate electrode 34. At the same time, the LDD area 86p of the p$^-$ type is formed in a front layer area of the SOI layer 16 in the element area 18 of the bi-polar transistor area 80 in areas not covered with the resist pattern RP7 and the dummy pattern 84.

In this step, in addition to the areas designated with the LDD area 86p shown in FIG. 2, the LDD area 86p is formed in an area designated with the base contact area 89. After the ion plantation is performed, the resist pattern RP7 is removed through ashing.

Figure 6A:
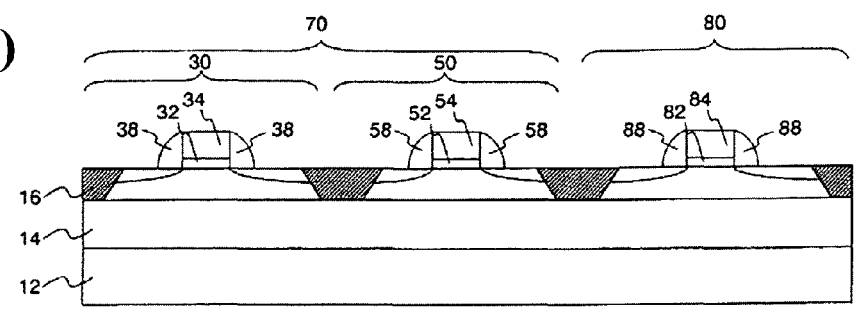
FIGS. 6(A) to 6(C) are schematic sectional views showing the method of producing the semiconductor device corresponding to sectional views taken along the line 1(A)-1(A) in FIG. 1(B) according to the first embodiment of the present invention.

In the next step, as shown in FIG. 6(A) and FIG. 1(B), the sidewall 38, the sidewall 58, and the sidewall 88 are formed on the side surfaces of the gate electrode 34, the gate electrode 54, and the dummy pattern 84 in the bi-polar transistor area 80, respectively.

More specifically, an insulation film of silicon dioxide (not shown) is formed on the SOI layer 16 in the MOS transistor area 70 and the bi-polar transistor area 80 for covering the side surfaces and upper surfaces of the gate electrode 34 and the gate electrode 54, and an upper surface and the side surface of the dummy pattern 84, side surfaces of the gate oxide film 32 and the gate oxide film 52, and a side surface of the second oxide film 82 through a CVD method and the likes. The insulation film has a thickness of about 1600 Å.

Then, the whole surface is etched through anisotropy dry etching. Accordingly, the sidewall 38, the sidewall 58, and the sidewall 88 are formed on the side surfaces of the gate electrode 34 and the gate oxide film 32, the side surfaces of the gate electrode 54 and the gate oxide film 52, and the side surfaces of the dummy pattern 84 and the second oxide film 82, respectively.

In the next step, as shown in FIG. 6(B), FIG. 1(B), and FIGS. 3(A) and 3(B), the p-type impurity is introduced into the SOI layer 16 in the p-type MOS transistor area 30 and the bi-polar transistor area 80 to form the source area 42s of the p-type and the drain area 42d of the p-type sandwiching the channel area 40 below the gate electrode 34 of the p-type MOS transistor area 30. At the same time, the base contact area 89 adjacent to the base area 90 below the dummy pattern 84 in the channel length direction is formed.

More specifically, using the photo-mask same as that for forming the resist pattern RP7 in the step shown in FIG. 5(D), a resist pattern RP9 is formed on the n-type MOS transistor area 50 and the bi-polar transistor area 80 in an area except areas where the collector area 92c and the emitter area 92e are formed and surrounding areas thereof. Then, the p-type impurity such as boron difluoride (BF$_2$) is introduced through an ion plantation under conditions at 15 keV and a dose amount of $1\times10^{13}$ cm$^{-2}$ with the resist pattern RP9, the gate electrode 34, and the sidewall 38 as masks.

Accordingly, the source area 42s of the p$^+$ type and the drain area 42d of the p$^+$ type are formed in the SOI layer 16 in the element area 18 of the p-type MOS transistor area 30 in areas not covered with the gate electrode 34 and the sidewall 38. Further, the channel area 40 is formed in the SOI layer 16 in a portion below the gate electrode 34 between the source area 42s and the drain area 42d.

At the same time, as shown in FIG. 1(B) and FIGS. 3(A) and 3(B), the base contact area 89 of the p-type is formed in the SOI layer 16 in the element area 18 of the bi-polar transistor area 80 in an area not covered with the resist pattern RP9, the dummy pattern 84, and the sidewall 88 adjacent to the area below the dummy pattern 84 in the channel length direction. Further, the impurity is introduced into the gate electrode 34 used as the mask as well. Accordingly, the gate electrode 34 becomes doped poly-silicon having an impurity concentration (concentration of the p-type impurity or boron) of about $1\times10^{20}$ cm$^{-3}$. After the ion implantation is performed, the resist pattern RP9 is removed through ashing.

Figure 6B:
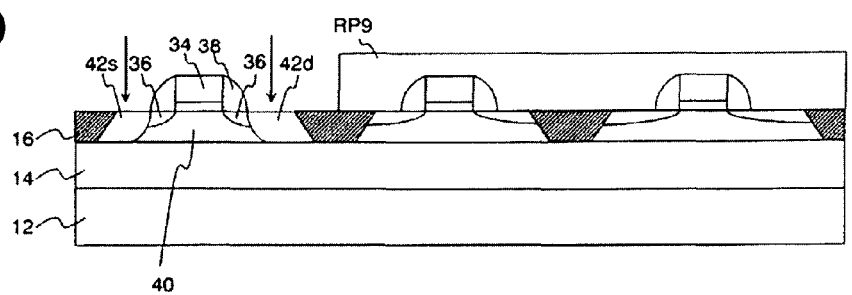
Figure 6C:
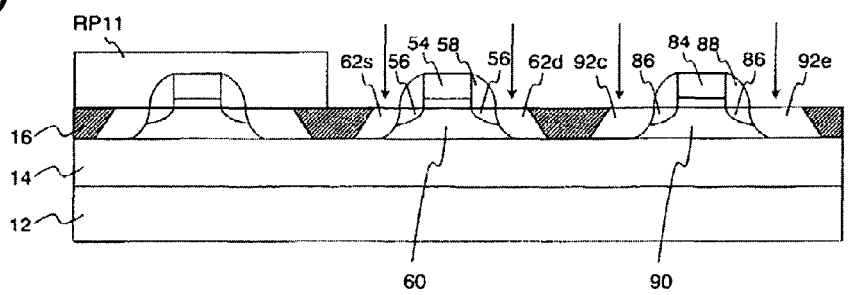

In the next step, as shown in FIG. 6(C) and FIG. 1(B), the n-type impurity is introduced into the SOI layer 16 in the n-type MOS transistor area 50 and the bi-polar transistor area 80 to form the source area 62s of the n-type and the drain area 62d of the n-type sandwiching the channel area 60 below the gate electrode 54 of the n-type MOS transistor area 50. At the same time, the collector area 92c of the n-type and the emitter area 92e of the n-type sandwiching the base area 90 below the dummy pattern 84 are formed.

More specifically, using the photo-mask same as that for forming the resist pattern RP5 in the step shown in FIG. 5(C), a resist pattern RP11 is formed on the p-type MOS transistor area 30 and the bi-polar transistor area 80 in an area except areas where the collector area 92c and the emitter area 92e are formed and surrounding areas thereof. Then, the n-type impurity such as phosphorous (P) is introduced through an ion plantation under conditions at 15 keV and a dose amount of $5.0\times10^{15}$ cm$^{-2}$ with the resist pattern RP11, the gate electrode 54, and the sidewall 58 as masks.

Accordingly, the source area 62s of the n$^+$ type and the drain area 62d of the n$^+$ type are formed in the SOI layer 16 in the element area 18 of the n-type MOS transistor area 50 in areas not covered with the gate electrode 54 and the sidewall 58. Further, the channel area 60 is formed in the SOI layer 16 in a portion below the gate electrode 54 between the source area 62s and the drain area 62d.

At the same time, the collector area 92c of the n+ type and the emitter area 92e of the n+ type are formed in the SOI layer 16 in the element area 18 of the bi-polar transistor area 80 in areas not covered with the resist pattern RP11, the dummy pattern 84, and the sidewall 88. At the same time, the base area 90 is formed in the SOI layer 16 in a portion below the dummy pattern 84 between the collector area 92c and the emitter area 92e.

Further, the impurity is introduced into the gate electrode 54 and the dummy pattern 84 used as the masks as well. Accordingly, the gate electrode 54 and the dummy pattern 84 become doped poly-silicon having an impurity concentration (concentration of the n-type impurity or phosphorous) of about $1 \times 10^{20}$ cm$^{-3}$. After the ion implantation is performed, the resist pattern RP11 is removed through ashing.

Up to the step shown in FIG. 6(C), the p-type MOS transistor 31, the n-type MOS transistor 51, and the bi-polar transistor 81 are formed on the SOI substrate 10. After the step, if necessary, a Salicide (Self Aligned Silicide) step may be adopted. That is, a conductive film of cobalt or titanium is formed through a sputtering method. Then, through a thermal process, surfaces of the source area 42s, the drain area 42d, the collector area 92c, the emitter area 92e and the base contact area 89 in the element areas 18, and surfaces of the gate electrode 34 and the dummy pattern 84 selectively become silicide, thereby lowering resistivity thereof.

Figure 7A:
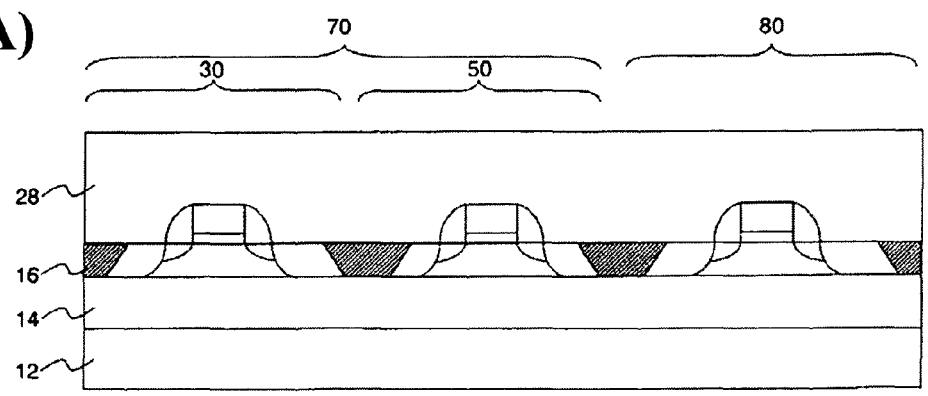
FIGS. 7(A) and 7(B) are schematic sectional views showing the method of producing the semiconductor device corresponding to sectional views taken along the line 1(A)-1(A) in FIG. 1(B) according to the first embodiment of the present invention.
Figure 8:
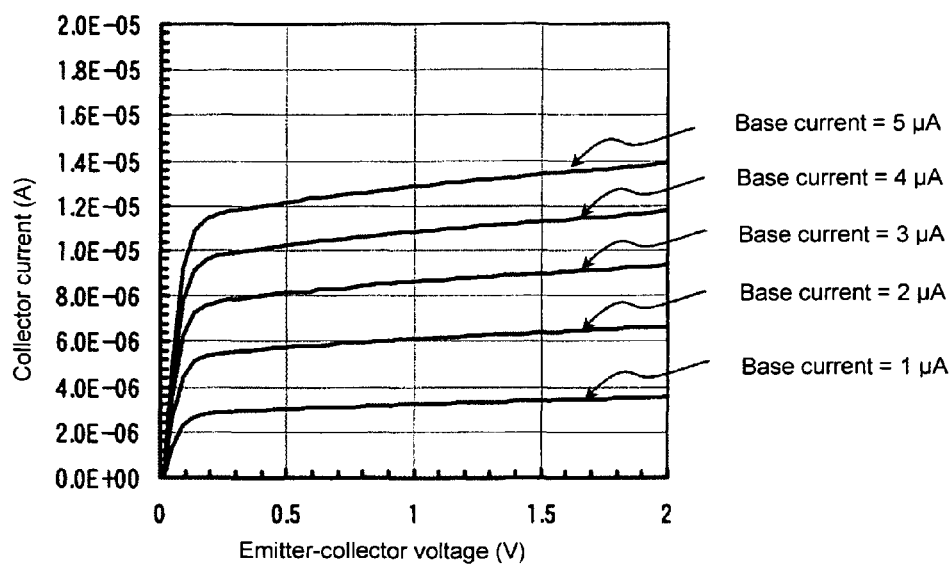
FIG. 8 is a graph showing an experimental result of an operational characteristic of a bi-polar transistor of the semiconductor device according to the first embodiment of the present invention.

In the next step, as shown in FIG. 7(A), an intermediate insulation film 28 is formed. More specifically, the intermediate insulation film 28 formed of silicon dioxide is disposed on the whole area through a CVD method and the likes, and the intermediate insulation film 28 is flattened through CMP. The intermediate insulation film 28 has a thickness of, for example, 9000 Å. Note that the intermediate insulation film 28 may be a single layer or a laminated layer formed of a plurality of types of insulation films.

Figure 7B:
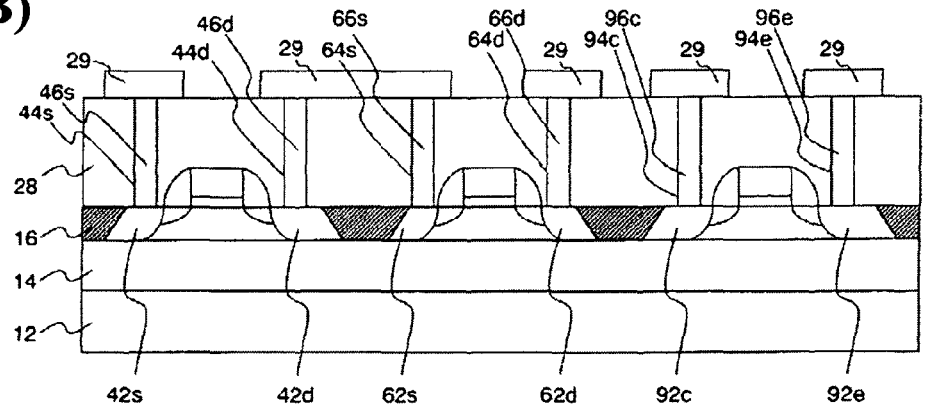

In the next step, as shown in FIG. 7(B), contact plugs and wiring patterns are formed in a wiring process. More specifically, contact holes 44s, 44d, 64s, 64d, 94c, and 94e are formed in the intermediate insulation film 28 through photolithography and etching, so that parts of the source area 42s, the source area 62s, the drain area 42d, the drain area 62d, the collector area 92c, and the emitter area 92e are exposed. At this time, contact holes (not shown) are formed in the intermediate insulation film 28 to expose parts of the gate electrode 34, the gate electrode 54, and the base contact area 89. Note that it is not necessary to form a contact hole reaching the dummy pattern 84, as the dummy pattern 84 does not function as an electrode.

In the next step, conductive films of a material such as tungsten and aluminum are filled in the contact holes and flattened, thereby forming contact plugs 46s, 46d, 66s, 66d, 96c, and 96e. At this time, contact plugs (not shown) reaching the gate electrode 34, the gate electrode 54, and the base contact area 89 are formed as well.

In the next step, a conductive film of a material such as aluminum is formed on the whole area. Then, a wiring pattern 29 is formed through photolithography and etching. If necessary, the wiring process is repeated several times, thereby completing a wafer process.

As described above, in the method of producing the semiconductor device according to the first embodiment of the present invention, it is possible to form the MOS transistors and the bi-polar transistor on the SOI substrate without significantly changing a method of producing an ordinary MOS transistor on an SOI substrate.

More specifically, only the step shown in FIG. 5(A), i.e., the ion implantation process for adjusting the bi-polar transistor characteristic, is added to the method of producing an ordinary MOS transistor on an SOI substrate. Accordingly, it is possible to form the MOS transistors and the bi-polar transistor on the SOI substrate through adjusting the mask pattern for forming the element areas, the gate electrodes, or the ion implantation. Accordingly, it is possible to produce the SOI-BICMOS without significantly changing the method of producing the conventional SOI-CMOS.

An experiment was conducted for evaluating an operational characteristic of the bi-polar transistor. FIG. 8 is a graph showing an experimental result of the operational characteristic of the bi-polar transistor of the semiconductor device according to the first embodiment of the present invention. As shown in FIG. 8, the semiconductor exhibits an excellent transistor characteristic with a reduced kink characteristic that is a problem of the conventional SOI-CMOS.

Second Embodiment

Figure 9:
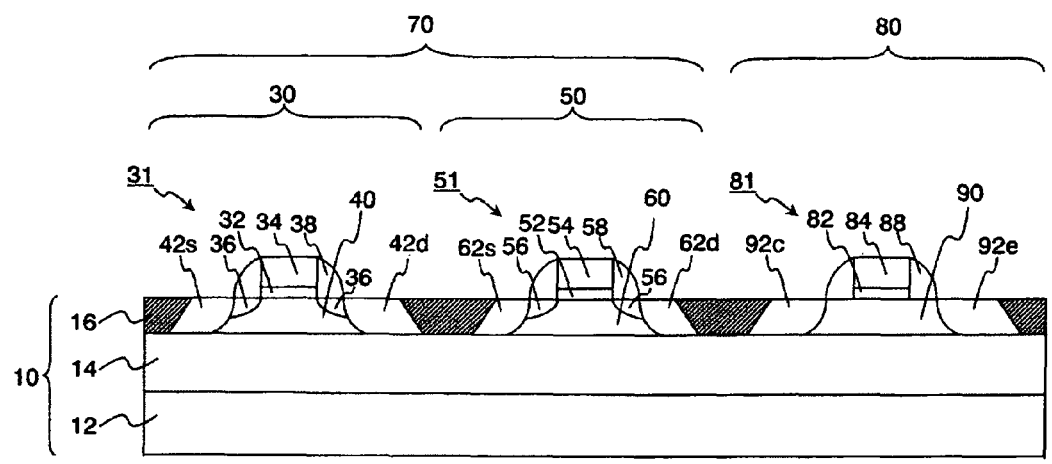
FIG. 9 is a schematic sectional view showing a semiconductor device according to a second embodiment of the present invention.
Figure 10:
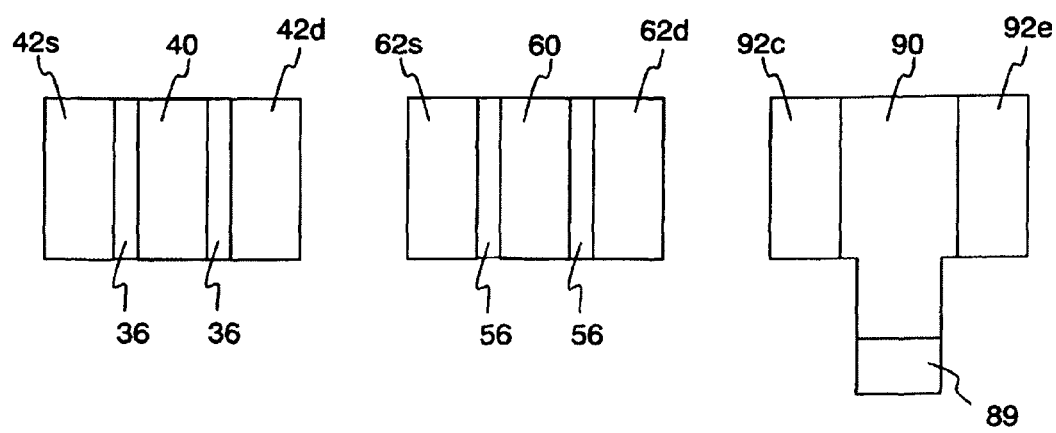
FIG. 10 is a schematic plan view showing the semiconductor device without an upper structure above an SOI (Silicon On Insulator) layer according to the second embodiment of the present invention.
Figure 11:
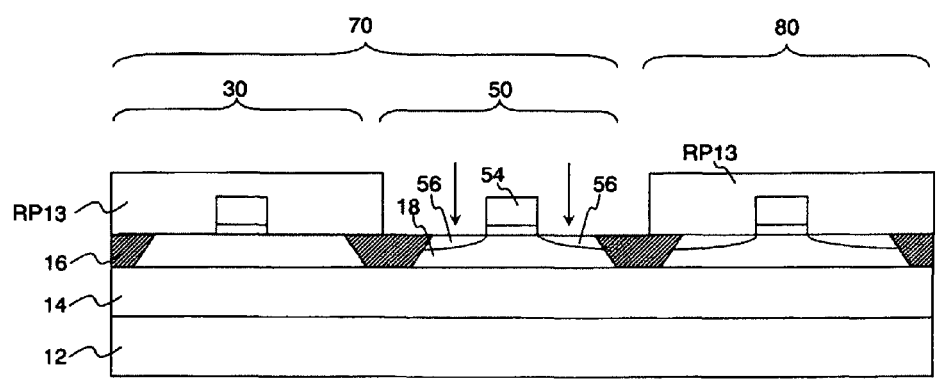
FIG. 11 is a schematic sectional view showing a method of producing the semiconductor device corresponding to a sectional view taken along the line 1(A)-1(A) in FIG. 1(B) according to the second embodiment of the present invention.

A second embodiment of the present invention will be explained next with reference to FIGS. 9 to 11. FIGS. 9 and 10 are a schematic sectional view and a schematic plan view showing a semiconductor device according to the second embodiment of the present invention. FIG. 11 is a schematic sectional view showing a method of producing the semiconductor device corresponding to a sectional view taken along the line 1(A)-1(A) in FIG. 1(B) according to the second embodiment of the present invention.

Components in the second embodiment similar to those in the first embodiment are designated by the same reference numerals, and explanations thereof are omitted. Explanations of steps in a production process in the second embodiment similar to those in the first embodiment are omitted.

A configuration of the semiconductor device according to the second embodiment of the present invention will be explained first with reference to FIGS. 9 and 10. FIG. 9 is a schematic sectional view showing a semiconductor device according to the second embodiment of the present invention. FIG. 10 is a schematic plan view showing the semiconductor device without an upper structure above an SOI (Silicon On Insulator) layer according to the second embodiment of the present invention.

In the second embodiment, different from the first embodiment, the LDD area is not disposed in the base area 90 in the bi-polar transistor area 80. Other configurations in the second embodiment are similar to those in the first embodiment.

In the embodiment, in addition to the effects in the first embodiment, the following effects can be obtained. First, in the semiconductor device according to the second embodiment, the LDD area is not disposed in the base area 90 in the bi-polar transistor area 80. In this case, the connection between the collector area 92c and the base area 90, and the connection between the emitter area 92e and the base area 90 become a PN connection simpler than the case that the LDD area is disposed in the base area 90 in the bi-polar transistor area 80. Accordingly, it is possible to reduce a fluctuation in a characteristic of the bi-polar transistor.

The method of producing the semiconductor device according to the second embodiment of the present invention will be explained next with reference to FIG. 11. FIG. 11 is a schematic sectional view showing the method of producing the semiconductor device corresponding to a sectional view taken along the line 1(A)-1(A) in FIG. 1(B) according to the second embodiment of the present invention. In the second embodiment, a process up to the step shown in FIG. 5(B) is similar to that in the first embodiment.

In the next step, instead of the step shown in FIG. 5(C) in the first embodiment, the step shown in FIG. 11 is performed. More specifically, as shown in FIG. 11, the LDD areas 56 of the n-type (n⁻ type) having a concentration lower than that of the source area 62s and the drain area 62d are formed in the element area 18 of the n-type MOS transistor area 50. More specifically, a resist pattern RP13 is formed on the p-type MOS transistor area 30 and the bi-polar transistor area 80.

In the step shown in FIG. 5(C) in the first embodiment, the resist pattern RP5 is formed on the p-type MOS transistor area 30 and the bi-polar transistor area 80 in the area except areas where the collector area 92c and the gate oxide film 52e are formed and surrounding areas thereof.

In the step shown in FIG. 11 in the second embodiment, on the other hand, the resist pattern RP13 is formed on the bi-polar transistor area 80 in the area including the areas where the collector area 92c and the gate oxide film 52e are formed and the surrounding areas thereof.

In the next step, the n-type impurity such as arsenic (As) is introduced through an ion plantation under conditions at 20 keV and a dose amount of $1\times10^{13}\ cm^{-2}$ with the resist pattern RP13 and the gate electrode 54 as masks. Accordingly, the LDD areas 56 of the n⁻ type having a concentration of the n-type impurity of about $1\times10^{19}\ cm^{-3}$ are formed in a front layer area of the SOI layer 16 in the element area 18 of the n-type MOS transistor area 50 in areas not covered with the gate electrode 54.

On the other hand, the LDD areas 86n of the n type are not formed in the SOI layer 16 in the element area 18 of the bi-polar transistor area 80. After the ion plantation is performed, the resist pattern RP13 is removed through ashing. The process after the step described above is similar to that in the first embodiment.

In the first embodiment, in the step of forming the LDD areas 56 of the n-type shown in FIG. 5(C), it is possible to use the photo mask same as that in the step of forming the high concentration diffused layer of the n-type shown in FIG. 6(C). In the second embodiment, on the other hand, in the step of forming the LDD areas 56 of the n-type shown in FIG. 11, it is necessary to use the photo mask different from that in the step of forming the high concentration diffused layer of the n-type shown in FIG. 6(C).

As described above, in the method of producing the semiconductor device according to the second embodiment of the present invention, it is possible to form the MOS transistors and the bi-polar transistor on the SOI substrate without significantly changing the method of producing an ordinary MOS transistor on an SOI substrate.

More specifically, similar to the first embodiment, only the step shown in FIG. 5(A), i.e., the ion implantation process for the base adjustment, is added to the method of producing an ordinary MOS transistor on an SOI substrate. Accordingly, it is possible to form the MOS transistors and the bi-polar transistor on the SOI substrate through adjusting the mask pattern for forming the element areas, the gate electrodes, or the ion implantation. Accordingly, it is possible to produce the SOI-BiCMOS, especially having a little fluctuation in the bi-polar transistor characteristic through not forming the LDD areas, without significantly changing the method of producing the conventional SOI-CMOS.

Third Embodiment

Figure 12:
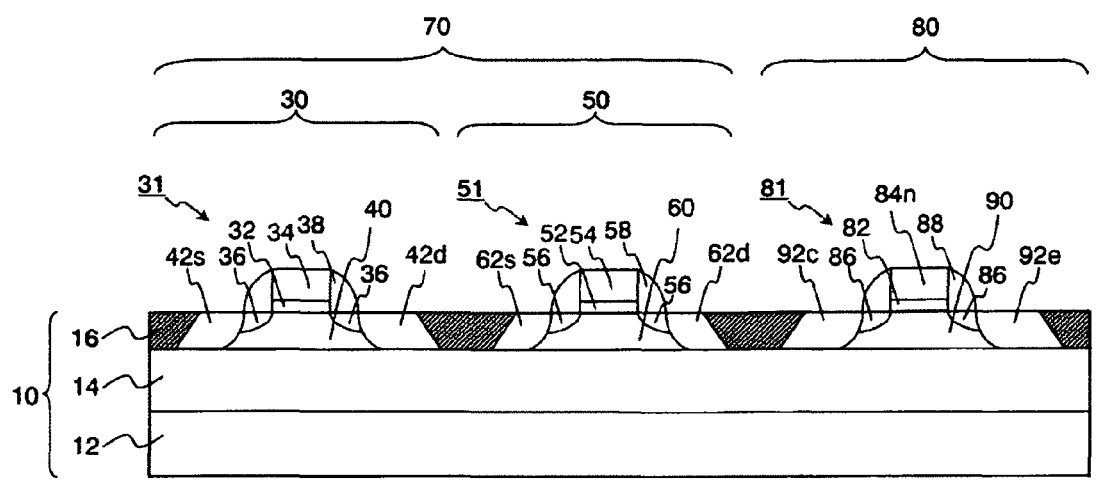
FIG. 12 is a schematic sectional view showing a semiconductor device according to a third embodiment of the present invention.
Figure 13:
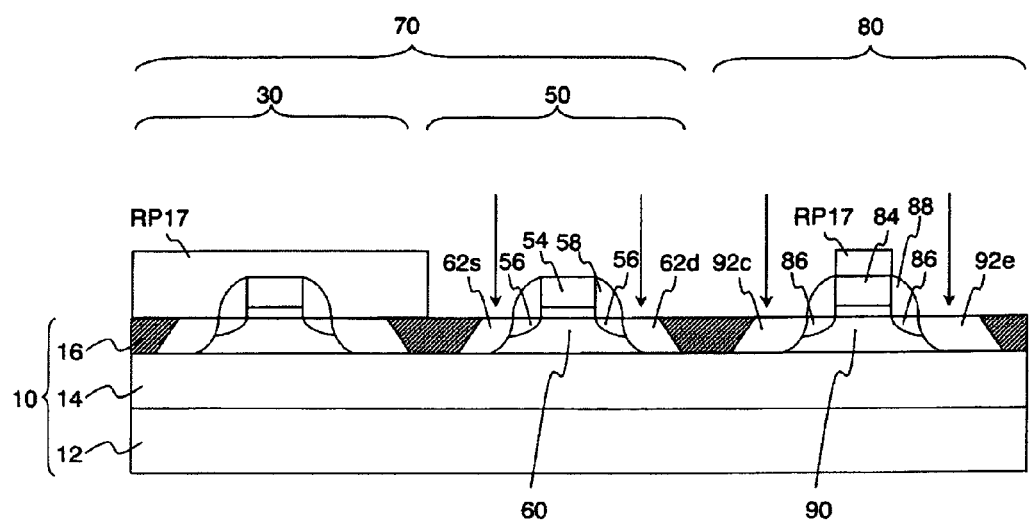
FIG. 13 is a schematic sectional view showing a method of producing the semiconductor device corresponding to a sectional view taken along the line 1(A)-1(A) in FIG. 1(B) according to the third embodiment of the present invention.

A third embodiment of the present invention will be explained next with reference to FIGS. 12 and 13. FIG. 12 is a schematic sectional view showing a semiconductor device according to the third embodiment of the present invention. FIG. 13 is a schematic sectional view showing a method of producing the semiconductor device corresponding to a sectional view taken along the line 1(A)-1(A) in FIG. 1(B) according to the third embodiment of the present invention.

Components in the third embodiment similar to those in the first embodiment are designated by the same reference numerals, and explanations thereof are omitted. Explanations of steps in a production process in the third embodiment similar to those in the first embodiment are omitted.

A configuration of the semiconductor-device according to the third embodiment of the present invention will be explained first with reference to FIG. 12. FIG. 12 is the schematic sectional view showing the semiconductor device according to the third embodiment of the present invention.

In the third embodiment, different from the first embodiment, the dummy pattern 84n of the bi-polar transistor area 80 has a low impurity concentration less than $1\times10^{19}\ cm^{-3}$. That is, in the first embodiment, the dummy pattern 84 has the impurity concentration (concentration of the n-type impurity or phosphorous) of about $1\times10^{20}\ cm^{-3}$, and is formed of so-called doped poly-silicon. In the third embodiment, on the other hand, the dummy pattern 84n of the bi-polar transistor area 80 has the impurity concentration less than $1\times10^{19}\ cm^{-3}$, and is formed of so-called non-doped poly-silicon. It is preferred that the dummy pattern 84n has the impurity concentration of substantially zero. Other configurations in the third embodiment are similar to those in the first embodiment.

In the embodiment, in addition to the effects in the first embodiment, the following effects can be obtained. In the bi-polar transistor of the present invention, hot carriers generated due to a collector current during the operation of the bi-polar transistor may not be completely withdrawn from the base contact area 89, and may jump into the second oxide film 82. In this case, when the bi-polar transistor area 80 is formed of the doped poly-silicon, a depleted layer extends from the second oxide film 82 mainly to the base area 90, thereby obstructing the collector current flowing in the base area 90, and causing a fluctuation in a characteristic of the bi-polar transistor.

In the third embodiment, on the other hand, the bi-polar transistor area 80 is formed of the non-doped poly-silicon. Accordingly, the depleted layer extends from the second oxide film 82 to not only the base area 90 but also the dummy pattern 84n, thereby minimizing the extension of the depleted layer in the base area 90. As a result, it is possible to minimize the obstruction of the collector current flowing in the base area 90, thereby reducing a fluctuation in a characteristic of the bi-polar transistor.

A method of producing the semiconductor device according to the third embodiment of the present invention will be explained next with reference to FIG. 13. FIG. 13 is a schematic sectional view showing the method of producing the semiconductor device corresponding to a sectional view taken along the line 1(A)-1(A) in FIG. 1(B) according to the third embodiment of the present invention. In the second embodiment, a process up to the step shown in FIG. 6(B) is similar to that in the first embodiment.

In the next step, instead of the step shown in FIG. 6(C) in the first embodiment, the step shown in FIG. 13 is performed in the third embodiment. More specifically, as shown in FIG. 13, the n-type impurity is introduced into the SOI layer 16 in the n-type MOS transistor area 50 and the bi-polar transistor area 80 to form the source area 62s of the n-type and the drain area 62d of the n-type sandwiching the channel area 60 below the gate electrode 54 of the n-type MOS transistor area 50. At the same time, the collector area 92c of the n-type and the emitter area 92e of the n-type sandwiching the base area 90 below the dummy pattern 84 are formed.

More specifically, a resist pattern RP17 is formed on the dummy pattern 84n in an area between areas where 92c and 92e are formed, in addition to on the p-type MOS transistor area 30 and the bi-polar transistor area 80 in the areas where the collector area 92c and the emitter area 92e are formed and surrounding areas thereof.

In the third embodiment, different from the first embodiment, the resist pattern RP17 is formed on the area between the areas where 92c and 92e are formed.

Then, the n-type impurity such as arsenic (As) is introduced through an ion plantation under conditions at 15 keV and a dose amount of $5.0 \times 10^{15}$ cm$^{-2}$ with the resist pattern RP17 and the gate electrode 54 as masks. Accordingly, the source area 62s of the n$^+$ type and the drain area 62d of the n$^+$ type are formed in the SOI layer 16 in the element area 18 of the n-type MOS transistor area 50 in areas not covered with the gate electrode 54 and the sidewall 58. Further, the channel area 60 is formed in an area below the gate electrode 54 between the source area 62s and the drain area 62d.

At the same time, the collector area 92c of the n$^+$ type and the emitter area 92e of the n$^+$ type are formed in the SOI layer 16 in the element area 18 of the bi-polar transistor area 80 in areas not covered with the resist pattern RP17 and the sidewall 88.

Further, the base area 90 is formed in an area below the dummy pattern 84n between the collector area 92c and the emitter area 92e. Note that the impurity is introduced into the gate electrode 54 used as the mask. Accordingly, the gate electrode 54 has an impurity concentration (concentration of the n-type impurity such as phosphorous) of about $1 \times 10^{20}$ cm$^{-3}$, and is formed of the so-called doped poly-silicon.

Different from the first embodiment, the dummy pattern 84n is covered with the resist pattern RP17, so that the impurity is not introduced into the dummy pattern 84n. Accordingly, the impurity concentration of the dummy pattern 84n remains low less than about $1 \times 10^{19}$ cm$^{-3}$. After the ion plantation is performed, the resist pattern RP17 is removed through ashing.

A process after the step described above is similar to that in the first embodiment. Note that a small amount of the n-type impurity is introduced into the dummy pattern 84n in the precedent impurity introduction process for forming the LDD areas shown in FIG. 5(C). An amount of the impurity introduced in the step shown in FIG. 5(C) is small, and the impurity concentration is small and can be called non-doped silicon.

In the first embodiment, in the step of forming the LDD areas 56 of the n-type shown in FIG. 5(C), it is possible to use the photo mask same as that in the step of forming the high concentration diffused layer of the n-type shown in FIG. 6(C). In the third embodiment, on the other hand, in the step of forming the LDD areas 56 of the n-type shown in FIG. 13, it is necessary to use the photo mask different from that in the step of forming the high concentration diffused layer of the n-type shown in FIG. 6(C).

In a modified process of the third embodiment, in the step of introducing the impurity for forming the LDD areas 56 shown in FIG. 5(C), a resist pattern is used for covering the dummy pattern 84n, in addition to the p-type MOS transistor area 30 and the area in the bi-polar transistor area 80 where the base contact area 89 is formed. Accordingly, it is possible to make the impurity introduced into the dummy pattern 84n substantially zero, thereby obtaining the effects of the third embodiment more effectively.

As described above, in the method of producing the semiconductor device according to the third embodiment of the present invention, it is possible to form the MOS transistors and the bi-polar transistor on the SOI substrate without significantly changing the method of producing an ordinary MOS transistor on an SOI substrate.

More specifically, similar to the first embodiment, only the step shown in FIG. 5(A), i.e., the ion implantation process for adjusting the bi-polar transistor characteristic, is added to the method of producing an ordinary MOS transistor on an SOI substrate. Accordingly, it is possible to form the MOS transistors and the bi-polar transistor on the SOI substrate through adjusting the mask pattern for forming the element areas, the gate electrodes, or the ion implantation. Accordingly, it is possible to produce the SOI-BiCMOS with a reduced fluctuation in the bi-polar transistor characteristic, especially through forming the dummy pattern 84n with non-doped silicon, without significantly changing the method of producing the conventional SOI-CMOS.

Fourth Embodiment

Figure 14:
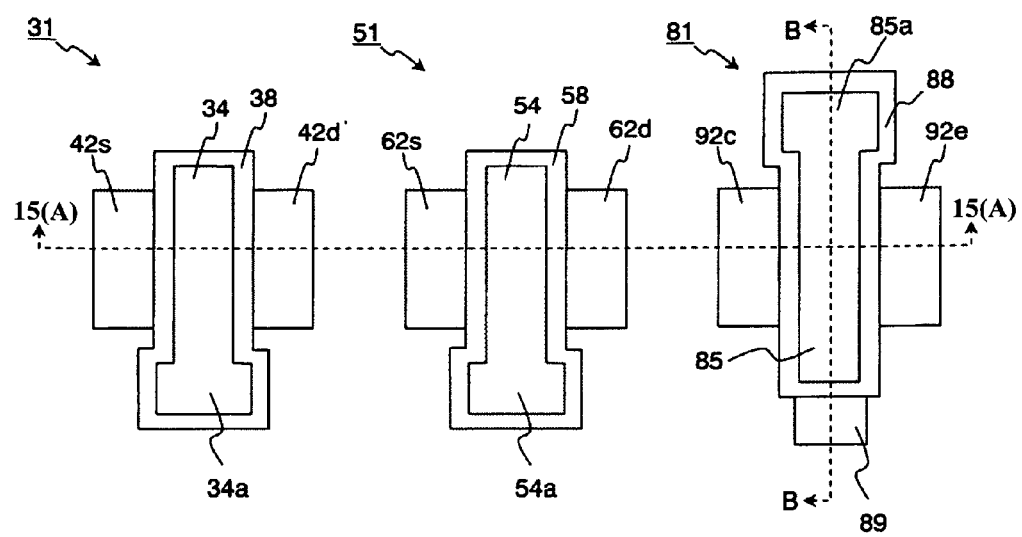
FIG. 14 is a schematic plan view showing a semiconductor device according to a fourth embodiment of the present invention.
Figure 15A:
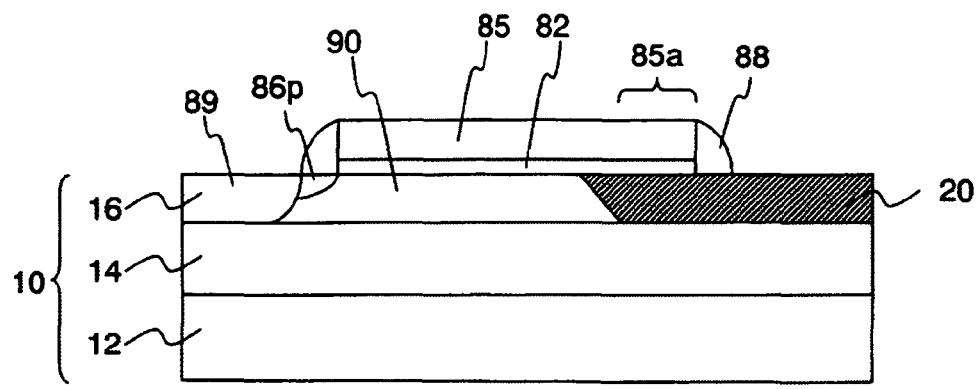
Figure 15B:
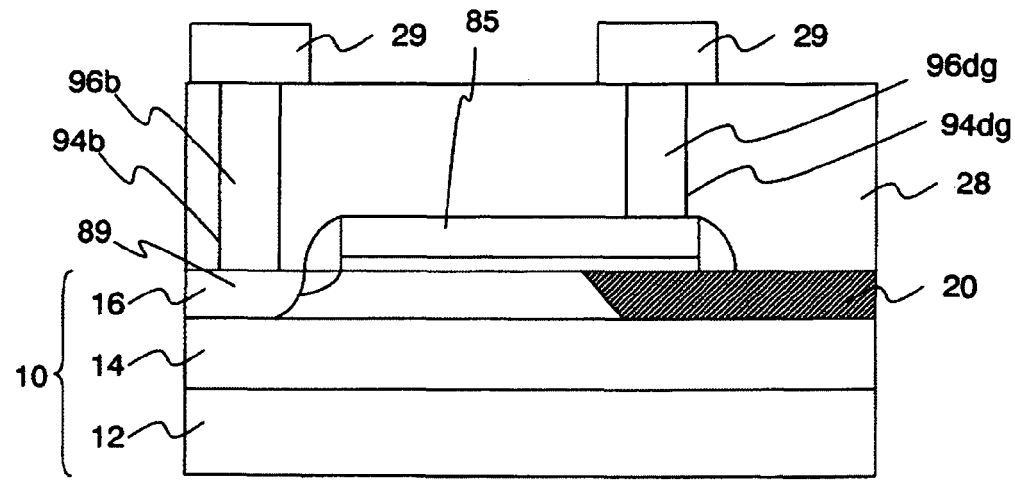

A fourth embodiment of the present invention will be explained next with reference to FIGS. 14, 15(A), and 15(B). FIG. 14 is a schematic plan view showing a semiconductor device according to the fourth embodiment of the present invention. FIGS. 15(A), and 15(B) are schematic sectional views showing the semiconductor device according to the fourth embodiment of the present invention.

Components in the fourth embodiment similar to those in the first embodiment are designated by the same reference numerals, and explanations thereof are omitted. Explanations of steps in a production process in the fourth embodiment similar to those in the first embodiment are omitted.

A configuration of the semiconductor device according to the fourth embodiment of the present invention will be explained first with reference to FIGS. 14, 15(A), and 15(B). FIG. 14 is a schematic plan view showing the semiconductor device according to the fourth embodiment of the present invention. FIG. 15(A) is a sectional view of the semiconductor device taken along a line 15(A)-15(A) in FIG. 14, and FIG. 15(B) is a sectional view thereof with a wiring layer formed thereon.

In the fourth embodiment, different from the first embodiment, a dummy pattern 85 is electrically connected a ground wiring. More specifically, as shown in FIG. 14, the dummy pattern 85 extends in the channel width direction (vertical direction in FIG. 14) toward an opposite side of the base contact area 89. Further, the dummy pattern 85 has a dummy pattern contact area 85a with a wide width on an area not above the base area 90. As shown in FIG. 15(B), a contact plug 96 electrically connected to the ground wiring is disposed on the dummy pattern contact area 85a.

Accordingly, the dummy pattern 85 is connected to a ground potential. It is preferred that the dummy pattern contact area 85a has a wide width as shown in FIG. 14 considering a dimensional error of a contact hole 94dg, and the dummy pattern contact area 85a does not necessarily have a wide width when it is possible to produce accurately. Note that the dummy pattern contact area 85a forms a part of the dummy pattern 85. Other configurations in the fourth embodiment are similar to those in the first embodiment.

In the embodiment, in addition to the effects in the first embodiment, the following effects can be obtained. In the bi-polar transistor of the present invention, hot carriers generated due to a collector current during the operation of the bi-polar transistor may not be completely withdrawn from the base contact area 89, and may jump into the dummy pattern 85. In this case, if the dummy pattern 85 is not electrically connected to any wirings and is in a floating state, a fluctuation in a characteristic of the bi-polar transistor may occur.

In the embodiment, the dummy pattern 85 is electrically connected to the ground wiring, so that the dummy pattern 85 is always connected to the ground potential during the operation of the bi-polar transistor 81. Accordingly, it is possible to reduce an influence of hot carriers jumping into the dummy pattern 85, thereby minimizing a fluctuation in a characteristic of the bi-polar transistor due to the hot carriers.

A method of producing the semiconductor device according to the fourth embodiment of the present invention will be explained next. In the fourth embodiment, steps in FIG. 5(B) and FIG. 7(B) are different from those in the first embodiment.

In the step shown in FIG. 5(B), when the thin film and the first oxide film 22 are patterned, the dummy pattern 85 is patterned to have a rectangular shape shown in FIG. 13, thereby forming the dummy pattern contact area 85a.

In the step shown in FIG. 7(B), when the contact holes are formed, the contact hole 94dg is formed as well, so that a part of the dummy pattern contact area 85a is exposed. Then, the conductive film is filled in the contact hole 94dg to form a contact plug 96dg, so that the wiring pattern 29 is disposed on the contact plug 96dg as well. Note that the wiring pattern 29 disposed on the contact plug 96dg becomes the ground wiring. Other steps in the fourth embodiment are similar to those in the first embodiment.

As described above, in the method of producing the semiconductor device according to the fourth embodiment of the present invention, it is possible to produce the SOI-BiCMOS without significantly changing a method of producing a conventional SOI-CMOS.

Further, in the method of producing the semiconductor device according to the fourth embodiment of the present invention, only the mask pattern for forming the gate electrode and the contact hole is different from that in the first embodiment. Accordingly, it is possible to produce the bi-polar transistor with a reduced fluctuation in the characteristic without significantly changing the method of producing the conventional SOI-CMOS.

The disclosure of Japanese Patent Application No. 2007-085459, filed on Mar. 28, 2007, is incorporated in the application by reference.

While the invention has been explained with reference to the specific embodiments of the invention, the explanation is illustrative and the invention is limited only by the appended claims.

What is claimed is:

1. A semiconductor device comprising:
a semiconductor layer formed on an insulation layer, said semiconductor layer having an MOS (Metal Oxide Semiconductor) transistor area and a bi-polar transistor area;
an MOS transistor formed in the semiconductor layer in the MOS transistor area, said MOS transistor including a source area of a second conductive type; a drain area of the second conductive type; and a channel area of a first conductive type formed between the source area and the drain area, said MOS transistor further including a gate electrode formed on the channel area with a first oxide layer inbetween; and
a bi-polar transistor formed in the semiconductor layer in the bi-polar transistor area, said bi-polar transistor including a collector area of the second conductive type; an emitter area of the second conductive type; a base area of the first conductive type formed between the collector area and the emitter area; a base contact area of the first conductive type adjacent to the base area in a channel width direction; and a dummy pattern formed on the base area with a second oxide layer inbetween, said base area being formed in a rectangular shape having two long sides along the channel width direction and two short sides perpendicular to the long sides;
a first LDD (Lightly Doped Drain) area of the first conductive type formed in the base area near a boundary between the base area and the base contact area along at least one of the short sides, said first LDD area having an impurity concentration lower than that of the base contact area;
a second LDD (Lightly Doped Drain) area of the second conductive type formed in the base area near a boundary along one of the long sides between the base area and the collector area and a boundary along the other of the long sides between the base area and the emitter area, said second LDD area having an impurity concentration lower than that of the collector area and the emitter area;
a third LDD (Lightly Doped Drain) area of the second conductive type formed in the channel area near a boundary between the channel area and the source area and a boundary between the channel area and the drain area, said third LDD (Lightly Doped Drain) area having an impurity concentration lower than that of the source area and the drain area; and
a fourth LDD (Lightly Doped Drain) area of the second conductive type near a boundary between the channel area and the source area and a boundary between the channel area and the drain area, said fourth LDD (Lightly Doped Drain) area having an impurity concentration lower than that of the source area and the drain area.

2. The semiconductor device according to claim 1, wherein said gate electrode is formed of a first material, said dummy pattern being formed of a second material the same as the first material.

3. The semiconductor device according to claim 1, wherein said dummy pattern has an impurity concentration less than $1 \times 10^{19}$ cm$^{-3}$.

4. The semiconductor device according to claim 1, wherein said dummy pattern is electrically connected to a ground wiring.

* * * * *